(12) United States Patent
Perlzmaier et al.

(10) Patent No.: US 10,158,042 B2
(45) Date of Patent: Dec. 18, 2018

(54) METHOD OF PRODUCING OPTOELECTRONIC SEMICONDUCTOR COMPONENTS AND OPTOELECTRONIC SEMICONDUCTOR COMPONENT

(71) Applicant: OSRAM Opto Semiconductors GmbH, Regensburg (DE)

(72) Inventors: Korbinian Perlzmaier, Regensburg (DE); Andreas Biebersdorf, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/679,426

(22) Filed: Aug. 17, 2017

(65) Prior Publication Data
US 2018/0062027 A1 Mar. 1, 2018

(30) Foreign Application Priority Data
Aug. 23, 2016 (DE) .................. 10 2016 115 644

(51) Int. Cl.
*H01L 33/00* (2010.01)
*H01L 33/22* (2010.01)
(Continued)

(52) U.S. Cl.
CPC ........ *H01L 33/0095* (2013.01); *H01L 33/007* (2013.01); *H01L 33/0066* (2013.01);
(Continued)

(58) Field of Classification Search
CPC ............... H01L 33/0095; H01L 33/007; H01L 33/0066
See application file for complete search history.

(56) References Cited

U.S. PATENT DOCUMENTS

2013/0320386 A1    12/2013  Schubert et al.
2016/0247841 A1*   8/2016   Cheng ................... H01L 31/036

FOREIGN PATENT DOCUMENTS

KR    10-0600373 B1    7/2006
WO    2015/008870 A2   1/2015

OTHER PUBLICATIONS

U. Khalique et al., "Investigation of $Al_2O_3$ Deposited by ALD as Passivation Layers for InP-based Nano Lasers," Proceedings Symposium IEEE/LEOS Benelux Chapter, 2008, Twente.
(Continued)

*Primary Examiner* — Errol Fernandes
(74) *Attorney, Agent, or Firm* — DLA Piper LLP (US)

(57) ABSTRACT

A method of producing optoelectronic semiconductor components includes A) providing a semiconductor layer sequence on a carrier top of a carrier, B) patterning the semiconductor layer sequence such that at least one mesa structure is formed with side faces, C) applying at least a portion of a cladding to the semiconductor layer sequence with the mesa structure by a conformal coating method such that all free surfaces are covered by the cladding), and D) anisotropically etching the cladding such that a flank coating is created from the cladding, which coating is limited with a tolerance of at most 200% of a mean thickness of the flank coating to the side faces of the mesa structure and completely encloses the mesa structure, wherein step D) takes place without an additional etching mask for the anisotropic etching.

13 Claims, 4 Drawing Sheets

(51) Int. Cl.
*H01L 33/24* (2010.01)
*H01L 33/30* (2010.01)
*H01L 33/32* (2010.01)
*H01L 33/44* (2010.01)
*H01L 33/46* (2010.01)
*H01L 31/0216* (2014.01)
*H01L 31/0232* (2014.01)
*H01L 31/0236* (2006.01)
*H01L 31/0304* (2006.01)
*H01L 31/0352* (2006.01)
*H01L 31/18* (2006.01)

(52) U.S. Cl.
CPC .......... *H01L 33/0079* (2013.01); *H01L 33/22* (2013.01); *H01L 33/24* (2013.01); *H01L 33/30* (2013.01); *H01L 33/32* (2013.01); *H01L 33/44* (2013.01); *H01L 33/46* (2013.01); *H01L 31/02161* (2013.01); *H01L 31/02327* (2013.01); *H01L 31/02363* (2013.01); *H01L 31/03046* (2013.01); *H01L 31/03048* (2013.01); *H01L 31/035281* (2013.01); *H01L 31/1844* (2013.01); *H01L 31/1848* (2013.01); *H01L 31/1868* (2013.01); *H01L 2933/0025* (2013.01)

(56) References Cited

OTHER PUBLICATIONS

Chung-Mo Yang et al., "Improvement in Electrical and Optical Performances of GaN-Based LED With $SiO_2/Al_2O_3$ Double Dielectric Stack Layer," IEEE Electron Device Letters, vol. 33, No. 4, Apr. 2012.

\* cited by examiner

A)

B)

C)

D)

E)

A)

B)

C)

A)

B)

C)

D)

E)

F)

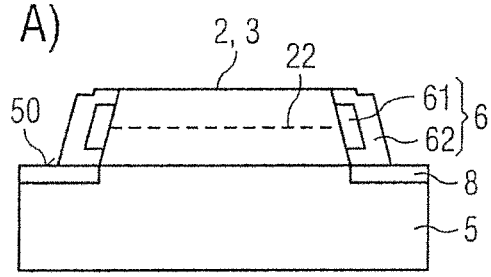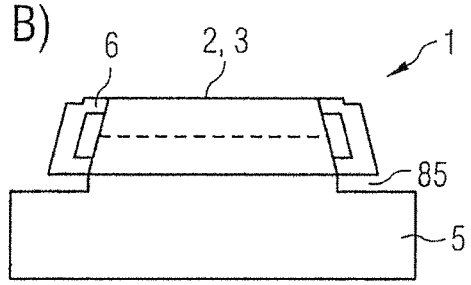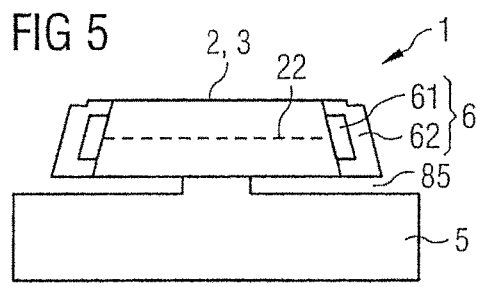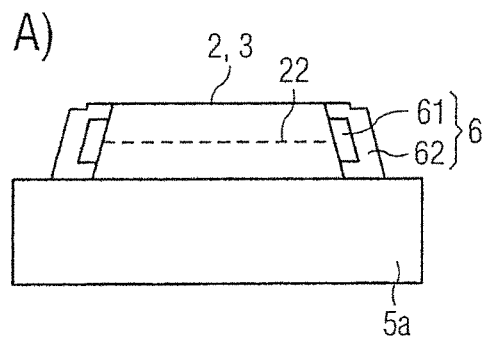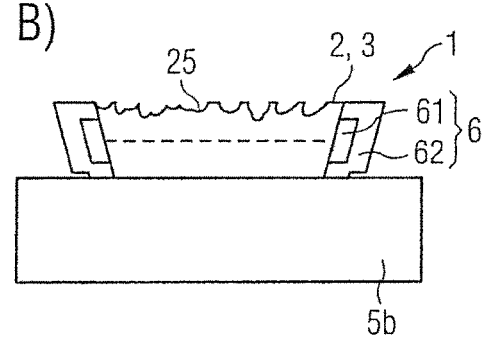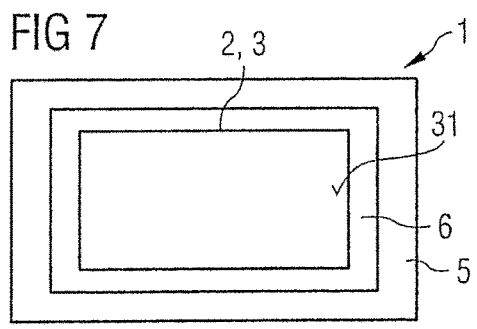

METHOD OF PRODUCING OPTOELECTRONIC SEMICONDUCTOR COMPONENTS AND OPTOELECTRONIC SEMICONDUCTOR COMPONENT

TECHNICAL FIELD

This disclosure relates to a method of producing optoelectronic semiconductor components and an optoelectronic semiconductor component.

BACKGROUND

There is a need to provide a method with which side faces of mesa structures of optoelectronic semiconductor components can be passivated efficiently and without a great adjustment outlay.

SUMMARY

We provide a method of producing optoelectronic semiconductor components including A) providing a semiconductor layer sequence on a carrier top of a carrier, B) patterning the semiconductor layer sequence such that at least one mesa structure is formed with side faces, C) applying at least a portion of a cladding to the semiconductor layer sequence with the mesa structure by a conformal coating method such that all free surfaces are covered by the cladding, and D) anisotropically etching the cladding such that a flank coating is created from the cladding, which coating is limited with a tolerance of at most 200% of a mean thickness of the flank coating to the side faces of the mesa structure and completely encloses the mesa structure, wherein step D) takes place without an additional etching mask for the anisotropic etching.

We also provide an optoelectronic semiconductor component including a semiconductor layer sequence with an active zone for the production of light, and a flank coating, wherein the flank coating has an inner first sublayer with a constant layer thickness and an outer second sublayer, the semiconductor layer sequence is patterned to a mesa structure with side faces lying externally, the active zone reaches as far as the side faces and is covered by both sublayers all around on the side faces, the second sublayer projects beyond the first sublayer along the side faces when seen in cross section such that the first sublayer is completely enclosed by the second sublayer together with the semiconductor layer sequence, and the flank coating is limited to the 4 side faces and covers the side faces to at least 90%.

BRIEF DESCRIPTION OF THE DRAWINGS

FIGS. 1A-1E, 2A-2C, 3A-3F, 4A-4B, 5 and 6A-6B are schematic sectional views of method steps of methods of producing optoelectronic semiconductor components.

FIG. 7 is a schematic top view of an example of an optoelectronic semiconductor component.

REFERENCE SIGN LIST

Figure 1:
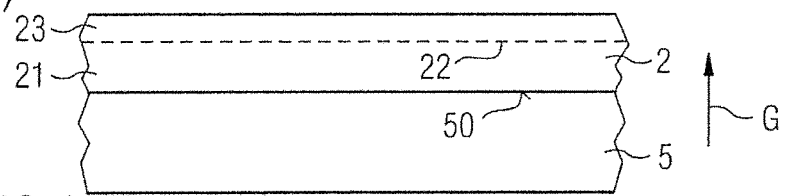
Figure 1:
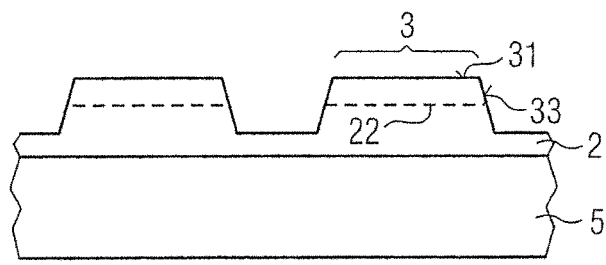
Figure 1:
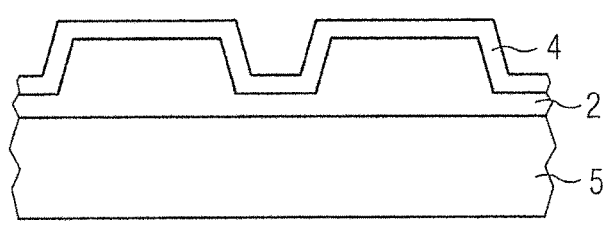
Figure 1:
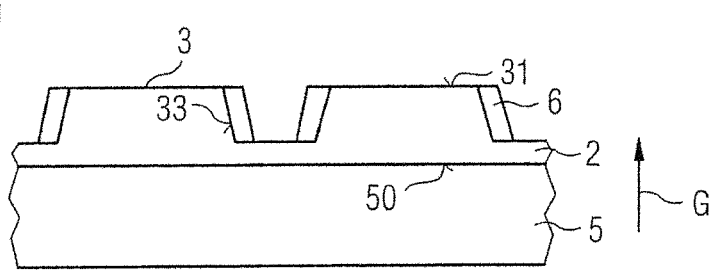
Figure 1:
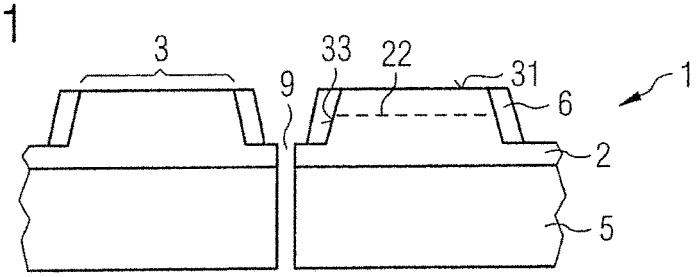

1 Optoelectronic semiconductor component
2 Semiconductor layer sequence
21 n-region of the semiconductor layer sequence
22 Active zone
23 p-region of the semiconductor layer sequence
25 Roughening
3 Mesa structure
31 Mesa top
32 Mesa underside
33 Side faces of the mesa structure
4 Cladding
41 First sublayer of the cladding
42 Second sublayer of the cladding
5 Carrier
50 Carrier top
6 Flank coating
61 First sublayer of the flank coating
62 Second sublayer of the flank coating
7 Etching mask layer
8 Sacrificial layer
85 Groove
9 Singulation trenches
G Growth direction of the semiconductor layer sequence

DETAILED DESCRIPTION

Our method may be used to produce optoelectronic semiconductor components. The semiconductor component is a laser diode, for example, or a photodetector. It is preferably a light-emitting diode (LED).

The method may comprise the step of providing a semiconductor layer sequence. The semiconductor layer sequence is located on a carrier top of a carrier. The carrier can be a growth substrate for the semiconductor layer sequence. It is likewise possible that the carrier is different from a growth substrate and was only mounted retrospectively on the semiconductor layer sequence after growing of the semiconductor layer sequence.

The semiconductor layer sequence has at least one active zone configured to produce radiation in operation of the light-emitting diode chip. The radiation produced is in particular incoherent. The semiconductor layer sequence is preferably based on a III-V compound semiconductor material. The semiconductor material is a nitride compound semiconductor material such as $Al_n In_{1-n-m} Ga_m N$, for example, or a phosphide compound semiconductor material such as $Al_n In_{1-n-m} Ga_m P$ or also an arsenide compound semiconductor material such as $Al_n In_{1-n-m} Ga_m As$ or $Al_n Ga_m In_{1-n-m} As_k P_{1-k}$, wherein respectively $0 \leq n \leq 1$, $0 \leq m \leq 1$ and $n+m \leq 1$ and $0 \leq k \leq 1$. For example, it applies in this case for at least one layer or for all layers of the semiconductor layer sequence that $0 \leq n \leq 0.8$, $0.4 \leq m3 \leq 1$ and $n+m \leq 0.95$ and $0 \leq k \leq 0.5$. The semiconductor layer sequence can have dopants as well as additional constituents. For the sake of simplicity, only the substantial constituents of the crystal lattice of the semiconductor layer sequence, thus Al, As, Ga, In, N or P are specified, even if these can be replaced or supplemented in part by small quantities of other substances.

The semiconductor layer sequence may be patterned. Patterning the semiconductor layer sequence preferably takes place by way of a phototechnical step in combination with etching. One or more mesa structures is or are formed during the patterning. The at least one mesa structure has side faces. The side faces are oriented transversely to the carrier top.

The method may comprise the step of applying at least one sublayer of a cladding to the semiconductor layer sequence. In other words, the cladding or the sublayer is applied to the mesa structures, in particular to all free surfaces. The cladding or the at least one sublayer may be produced using a conformal coating method. This means that the cladding or sublayer is applied to the free surfaces with a uniform, non-varying layer thickness. The coating method is, for example, chemical or physical vapor deposition, CVD or PVD for short, or atomic layer deposition (ALD).

The cladding may be anisotropically etched. A flank coating is thus created from the cladding. The flank coating is limited to the side faces of the mesa structure. This applies in particular with a tolerance of at most 200% or 100% or 50% of a mean thickness of the flank coating. The mean thickness of the flank coating is determined in particular in a direction perpendicular to the associated side face.

The flank coating may enclose the mesa structure completely all around. This can mean that when seen in a top view, the flank coating forms a continuous, uninterrupted ring around the mesa structure. When seen in a top view, this ring can be covered partially or completely by the mesa structure or this ring lies completely free or covers the mesa structure in places.

The anisotropic etching may take place without an additional etching mask. This means that there is no etching mask present, via which it is defined in which regions the anisotropic etching takes place, in this method step. In particular, no shadow masks are present in anisotropic etching. This means that anisotropic etching and thus production of the flank coating can take place in a self-adjusting manner. In anisotropic etching, a direction from which etching takes place and along which material removal takes place is oriented preferably perpendicular or approximately perpendicular to the carrier top.

The method may be configured to produce optoelectronic semiconductor components and may comprise the following steps:
A) provision of a semiconductor layer sequence on a carrier top of a carrier,
B) patterning of the semiconductor layer sequence so that at least one mesa structure is formed with side faces,
C) application of at least a portion or a sublayer of a cladding to the semiconductor layer sequence with the mesa structure by a conformal, isotropic coating method so that all free surfaces are covered by the cladding or the portion or the sublayer,
D) anisotropic etching of the cladding so that a flank coating is created from the previously applied portion of the cladding, which coating is limited with a tolerance of at most 200% of a mean thickness of the flank coating to the side faces of the mesa structure and completely encloses the mesa structure all around, wherein this step takes place without an additional etching mask for the anisotropic etching.

In light-emitting diodes in particular, a passivation of side faces of a mesa structure takes place by a two-dimensional deposition of a dielectric, which is subsequently opened selectively, for instance by an etching mask. Adjustment tolerances, which may reduce the yield of semiconductor components per growth wafer, are normally to be observed.

In the method described here, a modified process is used to passivate the side faces selectively of LEDs in particular. Using this method, even double-layer or multiple-layer systems can be applied. The layers applied can be used to facilitate a passivation through a first layer even in inclined side faces, wherein further layers can be used to protect the first layer. The side faces can thus be coated selectively without the need for separate adjustment. Furthermore, surfaces such as trenches between the mesa structures and light exit surfaces can remain free from the flank coating at the same time. Selective passivation of the side faces is thus possible without adjustment tolerances, even if the side flanks are oriented with a significant incline to a growth direction of the semiconductor layer sequence. Moreover, no parts of the flank coating remain on a radiation exit surface or in trenches or at points for singulation trenches.

The active zone of the semiconductor layer sequence may be located in the mesa structure. The active zone is configured to produce electromagnetic radiation, in particular visible light. For example, near-ultraviolet radiation, blue light, green light, yellow light, red light and/or near-infrared radiation is produced in the active zone.

During patterning of the semiconductor layer sequence the carrier top may be exposed in places. This means that the semiconductor layer sequence is removed completely from the carrier in regions. Alternatively, it is possible that the semiconductor layer sequence remains intact as a continuous layer with different thicknesses on the carrier top.

During anisotropic etching the carrier top and/or a mesa top of the mesa structures remote from the carrier may be freed from the cladding, in particular freed completely. This applies in turn preferably with a tolerance of at most 200% or 100% or 50% of the mean thickness of the flank coating.

The flank coating may reach as far as the carrier top and/or as far as the mesa top. This applies in particular after the step of anisotropic etching. In other words, the flank coating can cover the side faces completely or almost completely. In particular, it is possible that the flank coating touches the carrier top and/or the mesa top slightly.

The mesa structure may project following the step of anisotropic etching above the flank coating in a direction away from the carrier by at least 10 nm or 20 nm or 40 nm and/or by at most 1 µm or 0.5 µm or 0.2 µm. Alternatively, it is possible that the flank coating and the mesa structure end flush in a direction away from the carrier or even that the flank coating projects above the mesa structure, in particular projects slightly above it. Projecting slightly can signify a value of at most 50 nm or 20 nm or 10 nm.

The active zone may reach as far as the side faces. This means that when the mesa structure is produced, the active zone is exposed at the side faces.

The active zone may be completely covered by the flank coating on the side faces. Passivation of the active zone is achieved by the flank coating.

The active zone inside the respective mesa structure may be a continuous, coherent and/or unbroken layer. In other words, the active zone inside the respective mesa structure has no breaks or holes in this case.

The mean thickness of the flank coating may be at least 5 nm or 10 nm or 25 nm or 50 nm or 200 nm. Alternatively or in addition, the flank coating has a mean thickness of at most 20 µm or 10 µm or 3 µm or 1 µm or 0.5 µm. In particular, the flank coating has no or no significant variations in thickness over the side faces.

The mean thickness of the flank coating may be small with respect to a mean diameter of the mesa structure. In particular, the mean diameter of the mesa structure exceeds the mean thickness of the flank coating by at least a factor of 10 or 100 or 300. Alternatively or in addition, this factor is at most 10000 or 3000 or 1000.

A mean angle of the side faces to a growth direction of the semiconductor layer sequence may be at least −5° or −2° or 0° or 0.1° or 2° or 5° or 10°. Alternatively or in addition, this mean angle is at most 50° or 45° or 40° or 30° or 20° or 10° or 5°. Negative values mean that an undercut of the semiconductor layer sequence is formed by the side faces, for instance when seen in a top view. The growth direction of the semiconductor layer sequence is preferably oriented perpendicular or approximately perpendicular to the carrier top so that the mean angle is then at least −5° and at most 5° or at least 0.1° and at most 2°. Alternatively, the mean angle of the side faces to the growth direction is relatively large and is preferably between 20° and 45°. Up to a rotation of 90° the aforesaid angles to the growth direction preferably apply also with regard to the carrier top. The angles can relate to the overall side faces or, seen in projection onto the growth direction, to at least 60% or 85% or 95% of the side faces.

The cladding and/or the flank coating may each be composed of several directly consecutive sublayers. In this case, the individual sublayers can have degrees of coverage that diverge from one another with respect to the side faces. For example, sublayers lying further inside cover the side faces to a smaller extent than side faces lying further out. The sublayers can have different extensions along the side faces, in particular when seen in cross section parallel to the growth direction.

The sublayers may have different materials from one another. This can apply to all sublayers in relation to one another or to at least directly consecutive sublayers.

A second of the sublayers may be applied in a step F). The step F) preferably follows the step D), in which the anisotropic etching of the cladding or at least of a portion of the cladding takes place.

A first of the sublayers may be isotropically etched in a step E), which is preferably carried out between the steps D) and F). This first sublayer is located in particular directly on the mesa structure.

The first sublayer may or may not touch the carrier top after step E). In this case, the active zone is preferably still completely covered by the first sublayer after step E).

The second sublayer may touch the carrier top and/or the side faces in places after step F). In particular, the second sublayer is also applied by a conformal, isotropic coating method, as applies especially preferably to all sublayers of the cladding and the flank coating.

Following step F), the second sublayer may be anisotropically etched in a step G). The step G) for the second sublayer corresponds in this case especially preferably to the step D) for the first sublayer. The same can apply to other optionally present sublayers of the cladding and to the flank coating.

The sublayers may be applied in steps C) and/or F) using different application methods, wherein the application is preferably carried out conformally and on all free surfaces with a uniform thickness in each case. For example, production of the cladding and the associated sublayer takes place in step C) by atomic layer deposition or ALD for short. In contrast, application in step F) can take place by chemical or physical vapor deposition, CVD or PVD for short, or by a printing or spin-coating process. If several of the sublayers are applied in step C) and/or in step F), all sublayers can be applied using the same or also different application methods within step C) and/or step F).

The second sublayer may have a greater thickness than the first sublayer. For example, the second sublayer is thicker than the first sublayer by at least a factor of 1.5 or 3 or 5 and/or by at most a factor of 50 or 20 or 10.

At least some of the sublayers or all sublayers may be electrically insulating. Thus, the cladding as well as the flank coating are preferably electrically insulating as a whole.

At least one of the sublayers or all sublayers and thus the cladding and/or the flank coating may be transmissive for visible light, in particular transparent. Moreover, it is possible that light-transmissive layers are combined with reflective layers, for instance of a diffusely reflective, white dielectric material or of a mirroring, specularly reflective material such as a metal. The flank coating can thus be designed as a mirror.

An etching mask layer may be applied. The etching mask layer is configured for isotropic etching and not for the anisotropic etching of the cladding. The etching mask layer is preferably applied isotropically, conformally and all over. Furthermore, the etching mask layer is preferably applied in step C) and/or before step D) to the cladding or to the corresponding sublayer of the cladding, which is processed in steps C) and D).

The etching mask layer may be removed in a subsequent method step, preferably completely removed. The etching mask layer is thus not a part of the finished semiconductor component. In particular, the etching mask layer is used to etch the first sublayer in step E).

The carrier may comprise a sacrificial layer, in particular on the carrier top. The sacrificial layer can preferably be etched selectively with respect to the flank coating and/or with respect to at least one of the sublayers of the flank coating, for example, by wet etching.

The sacrificial layer may be partly or completely removed preferably after step D) in regions not covered by the mesa structure. It is possible for the sacrificial layer to be partly removed or also retained in regions between the mesa structure and the carrier. The mesa structure can thus project temporarily or even permanently above the sacrificial layer all around.

The at least partial removal of the sacrificial layer by etching may take place only after the flank coating has been completed, thus in particular only after step G). By removal of the sacrificial layer, it can be achieved that the flank coating no longer touches the carrier. Furthermore, a detachment of the mesa structures and the flank coating from the carrier can be made easier by the removal of the sacrificial layer.

A complete detachment of semiconductor layer sequence from the carrier may take place by a mechanical force, for example, by cutting or scraping off. This step is preferably carried out after the partial removal of the sacrificial layer.

The carrier may be completely removed from the semiconductor layer sequence after step D), preferably after step G). In particular, the carrier is replaced by a substitute carrier for a mechanical stabilization and/or electrical contacting of the semiconductor layer sequence.

The carrier may be singulated in regions between the mesa structures after step D), in particular after step G). Singulation is carried out by laser radiation, sawing and/or grinding, for example. If laser radiation is used, internal material damage by laser radiation and subsequent fracturing or etching may be involved, also termed stealth dicing. It is further possible for singulation to take place by scribing and breaking.

No material of the flank coating may be removed during singulation. In other words, the flank coating is not affected by singulation. It is possible in this case for the flank coating to be spaced from singulation trenches.

The flank coating, in particular the first sublayer, may comprise one or more of the following materials or consists of one or more of these materials: aluminum oxide, aluminum nitride. The first sublayer is preferably of aluminum oxide.

The flank coating, in particular the second sublayer, may comprise one or more of the following materials or consists of one or more of these materials: an oxide with aluminum, silicon, titanium and/or tantalum, a nitride with aluminum, silicon, titanium, tantalum and/or tungsten, titanium tungsten nitride, a parylene, a silicone, a silazane, a photoresist, an ormocer. The second sublayer is preferably formed from silicon dioxide, titanium dioxide or a tantalum oxide.

The carrier may comprise one or more of the following materials or consists of one or more of these materials: silicon, germanium, molybdenum, sapphire, a polymer, an epoxy or a filled epoxy, a silicone.

Our optoelectronic semiconductor component is preferably produced using a method such as specified in connection with one or more of the aforesaid examples. Features of the method are therefore disclosed for the semiconductor component also and vice versa.

The optoelectronic semiconductor component may comprise a semiconductor layer sequence with an active zone for the production of light and a flank coating. The flank coating has an inner, first sublayer with a constant layer thickness and an outer, second sublayer. The semiconductor layer sequence is patterned to a mesa structure with side faces lying externally. The active zone reaches as far as the side faces and the side faces are covered all around by the sublayers so that the active zone is passivated and protected by the flank coating. The second sublayer projects above the first sublayer when seen in cross section along the side faces, preferably at opposing ends, in particular in a direction parallel and in a direction antiparallel to a growth direction of the semiconductor layer sequence. The first sublayer is completely enclosed by the second sublayer together with the semiconductor layer sequence. The flank coating is limited to the side faces, wherein the side faces are preferably oriented transversely to a radiation exit side of the semiconductor layer sequence. The side faces are preferably covered to at least 50% or 90% or 95% or completely by the flank coating.

A method described here and an optoelectronic semiconductor component described here are explained in greater detail below with reference to the drawing by means of examples. The same reference signs indicate identical elements in the individual figures. However, no references to scale are shown, but rather individual elements can be shown exaggeratedly large for better understanding.

FIG. 1 shows an example of a production method for optoelectronic semiconductor components 1. The semiconductor components 1 are preferably light-emitting diodes.

According to FIG. 1A, a carrier 5 with a carrier top 50 is provided. On the carrier top 50 a semiconductor layer sequence 2 is grown in a direction of growth G. The semiconductor layer sequence has an n-conductive region 21, a p-conductive region 23 and an active zone 22 lying in between. The active zone 22 is configured to produce radiation in operation of the finished semiconductor device.

In FIG. 1B, mesa structures 3 are produced. The mesa structures 3 are formed, for example, by etching, wherein photomasks, not shown, can be used. Side faces 33 of the mesa structure 3 are formed by this patterning. The mesa structures 3 further have mesa tops 31 remote from the carrier 5. Inside the mesa structures 3, the active zone 22 is designed to be continuous, unbroken and uninterrupted and reaches as far as the side faces 33.

During production of the mesa structures 3, the semiconductor layer sequence 2 between the mesa structures 3 is not completely removed according to FIG. 1B. Thus, the semiconductor layer sequence 2 remains as a continuous layer on the carrier 5.

FIG. 1C shows that a cladding 4 is applied to the semiconductor layer sequence 2 and thus to all exposed faces. The production of the cladding 4 takes place preferably using atomic layer deposition, for example. The cladding 4 is formed from $Al_2O_3$, for example. The conformally applied cladding 4 has a constant thickness throughout.

In the method step in FIG. 1D, the cladding 4 from FIG. 1C is etched anisotropically. For example, a constant material removal takes place along the growth direction G by dry etching, for instance. The cladding 4 thus remains as a flank coating 6 only on the side faces 33 of the mesa structures 3. All other surfaces are freed from the cladding 4. Only at base points of the mesa structures 3 is the semiconductor layer sequence 2 between adjacent mesa structures 3 covered by the flank coating 6, wherein this covering region has a width that is equal to the thickness of the flank coating 6.

FIG. 1E illustrates that singulation trenches 9 are formed, which split the semiconductor layer sequence 2 and the carrier 5 in regions between the mesa structures 3 and between adjacent flank coatings 6. The separate, individual semiconductor components 1 are formed by this singulation. Such a singulation is also possible in all other examples.

Figure 2:
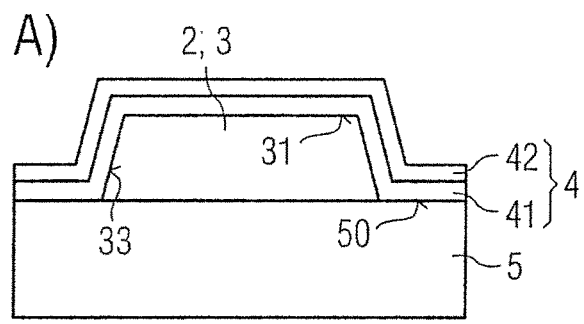
Figure 2:
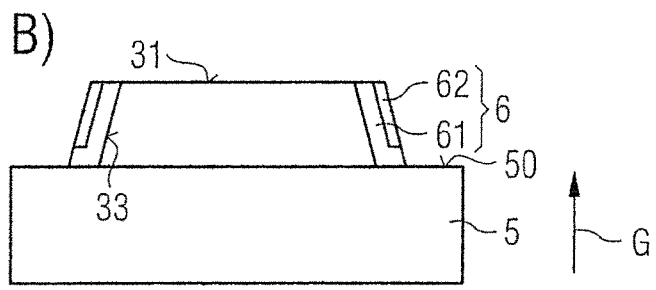
Figure 2:
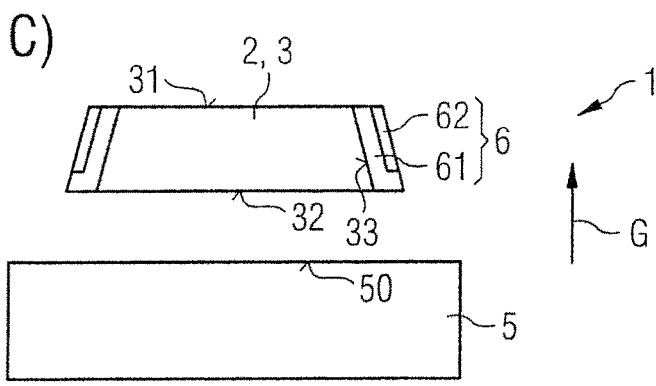

Another example of the production method is illustrated in FIG. 2. In FIG. 2A shows that the cladding 4 has two sublayers 41, 42, which are applied to the mesa structure 3 conformally and with a constant thickness directly over one another. In this case, the semiconductor layer sequence 2 is removed down to the carrier top 50 in regions next to the mesa structures 3, as can be in all other examples also. Thus, the carrier top 50 is directly covered by the first sublayer 41 in places.

FIG. 2B illustrates that the cladding 4 is removed from the carrier top 50 and from the mesa top 31 by anisotropic etching. Thus, the sublayers 61, 62 of the flank coating 6 remain on the side faces 33.

Due to the anisotropic etching, the second layer 62 lying further out does not extend as far as the carrier top 50, unlike the first sublayer 61 lying inside. The sublayers 61, 62 preferably end in a direction away from the carrier top 50 flush in each case with the mesa top 31. Viewed in cross section perpendicular to the growth direction G, the inner, first sublayer 61 is formed L-shaped and the second, outer sublayer 62 runs linearly along a straight line. Following the anisotropic etching, the second sublayer 62 is thinner than the first sublayer 61, before etching the sublayer 42 can be thicker than the first sublayer 41.

Along the growth direction G, the region in which only the first sublayer 61 is located in the flank coating 6 makes up a proportion of at least 0.5% or 1% or 2%, for example, relative to the total thickness of the mesa structure 3. Alternatively or in addition, this proportion is at most 30% or 20% or 10% or 5%.

In the method step in FIG. 2C, the carrier 5 is removed from the mesa structure 3 so that a mesa underside 32 is exposed. The mesa underside 32 is opposite the mesa top 31. The mesa top 31 and the mesa underside 32 are oriented approximately perpendicular to the growth direction G, form main faces of the mesa structure 3 and connect to one another by the side faces 33.

Such a detachment of the semiconductor layer sequence 2 from the carrier 5 can take place in all other exemplified embodiments also. Deviating from the representation in FIG. 2, several of the mesa structures 3 are especially preferably present on the carrier 5, as illustrated in FIG. 1.

Figure 3:
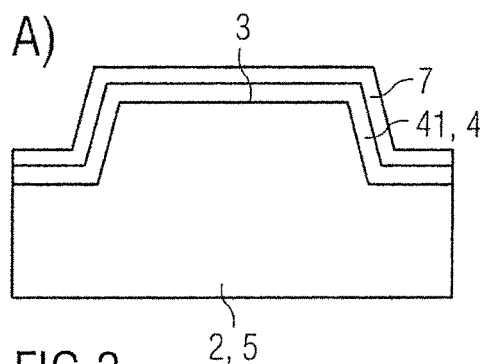
Figure 3:
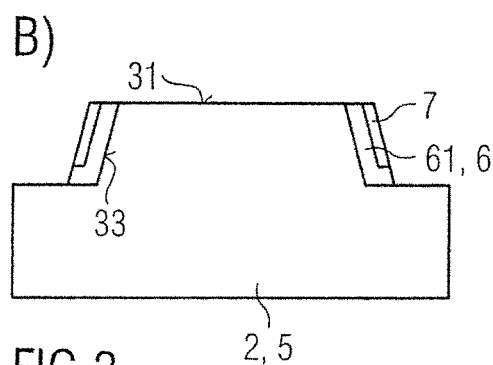
Figure 3:
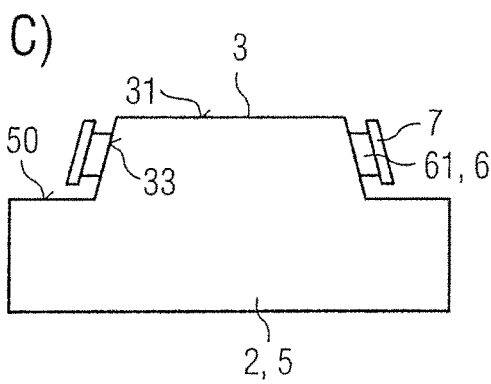
Figure 3:
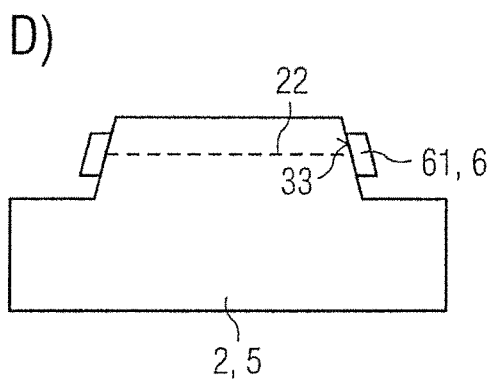
Figure 3:
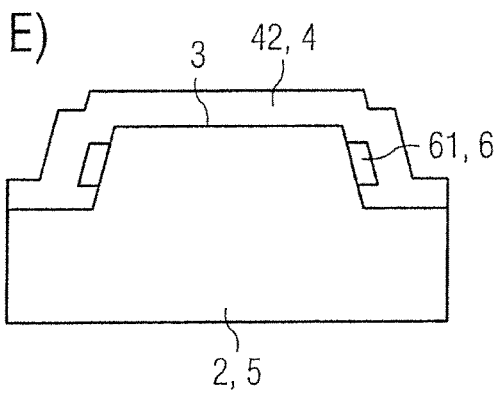
Figure 3:
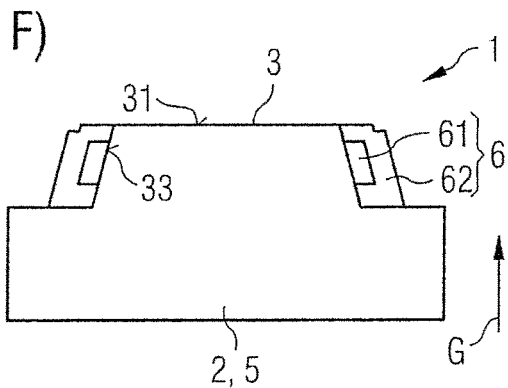

In the example in FIG. 3 also, several sublayers 41, 42 of the cladding 4 are applied for the flank coating 6, wherein in the finished flank coating 6 the second, outer sublayer 62 encapsulates the inner sublayer 61. The method steps of FIGS. 3A and 3B take place by analogy with the method steps of FIGS. 2A and 2B. However, in this case the outer cladding layer 42 from FIG. 2A is replaced in figure A by an etching mask layer 7. The etching mask layer 7 is realized by a photoresist, for example.

In FIG. 3C, an isotropic etching step takes place, for example, by wet chemical etching. Preferably only the first sublayer 61 is affected by this isotropic etching. The etching mask layer 7 thus functions as an etching mask for the isotropic etching of the first sublayer 61. Following the isotropic etching, the first sublayer 61 no longer touches the top 50. The etching mask layer 7 can project beyond the first sublayer 61 all around.

FIG. 3D illustrates that the etching mask layer 7 is completely removed. The side faces 33 are only partially covered by the first sublayer 61, wherein the first sublayer 61 completely covers the active zone 22 all around on the side faces 33.

In the method step in FIG. 3E, the second sublayer 42 of the cladding 4 is applied to the entire surface conformally and in a uniform thickness. Anisotropic etching follows thereupon, see FIG. 3F. Seen in cross section, the second sublayer 62 of the flank coating 6 remains in a U-shape over the first sublayer 61. The first sublayer 61 is completely enclosed all around by the semiconductor layer sequence 2 of the mesa structure 3 together with the second sublayer 62. Due to the conformal application of the second sublayer 42 in the step in FIG. 3E, it is possible for the second sublayer 62 in FIG. 3F to be restored on one edge along the growth direction G with respect to the mesa top 31.

In FIG. 3, the first sublayer 61 is preferably an ALD layer of $Al_2O_3$ and the second sublayer 62 is a CVD layer, preferably of silicon dioxide.

FIG. 4A illustrates that the carrier top 50 is formed in places by a sacrificial layer 8. The sacrificial layer 8 can be etched selectively with respect to the carrier 5, the semiconductor layer sequence 2 and the second sublayer 62. The flank coating 6 is preferably applied, as explained in connection with FIG. 3. The sacrificial layer 8 is preferably of silicon dioxide, for example.

According to FIG. 4B, the sacrificial layer 8 is removed. Due to this a plinth remains on the carrier 5 underneath the mesa structure 3, on which plinth the semiconductor layer sequence 2 is located. It is possible for this plinth to end flush with the semiconductor layer sequence 2. Thus, the flank coating 6 does not touch the carrier 5 or only touches it slightly at one edge of the plinth that lies on the mesa structure 3.

Alternatively, it is possible as shown in FIG. 5, for the sacrificial layer to extend in part between the semiconductor layer sequence 2 and the carrier 5 or over the entire carrier 5. Following the at least partial removal of the sacrificial layer 8, the semiconductor layer sequence 2 can thus project beyond the plinth all around. Subsequently, not shown, the carrier 5 can easily be completely removed from the semiconductor layer sequence 2 via a mechanical force.

If the sacrificial layer 8 extends, other than shown, over the entire carrier 5, the plinth can be formed by remaining material of the sacrificial layer 8. A size of the plinth can be adjusted in this case by the duration of the removal of the sacrificial layer 8.

FIG. 6A shows that the semiconductor layer sequence 2 is produced on a growth substrate 5a as a first carrier. Subsequently, as shown in FIG. 6B, rebonding onto a substitute carrier 5b takes place and the growth substrate 5a is removed. The semiconductor layer sequence 2 can thus widen in a direction away from the carrier 5B. The same can apply to all other examples.

The rebonding onto the substitute carrier 5b can be carried out here before the production of the cladding 4 and the flank coating 6. In particular, the side faces 33 can be inclined in this case towards the carrier 5, 5a, 5b when forming the flank coating 6, as illustrated in FIG. 6B.

A roughening 25 is optionally produced on a side of the semiconductor layer sequence 2 remote from the carrier 5b. A roughening 25 of this kind can also be present in all other examples. To simplify the illustration, other components of the semiconductor component 1 such as ohmically conductive current spreading layers or external electrical contact surfaces are not shown.

In the top view of FIG. 7, it is to be seen that the flank coating 6 surrounds the mesa structure 3 as well as the mesa top 31 all around in a closed annular path with a uniform thickness. A design of this kind is preferably present in all other examples.

Our components and methods are not limited by the description with reference to the examples. On the contrary, this disclosure comprises every new feature as well as every combination of features, which includes in particular every combination of features in the appended Claims, even if the feature or combination is not itself explicitly indicated in the Claims or examples.

This application claims priority of DE 10 2016 115 644.2, the subject matter of which is incorporated herein by reference.

The invention claimed is:

1. A method of producing optoelectronic semiconductor components comprising:
   A) providing a semiconductor layer sequence on a carrier top of a carrier,
   B) patterning the semiconductor layer sequence such that at least one mesa structure is formed with side faces,
   C) applying at least a portion of a cladding to the semiconductor layer sequence with the mesa structure by a conformal coating method such that all free surfaces are covered by the cladding), and
   D) anisotropically etching the cladding such that a flank coating is created from the cladding, which coating is limited with a tolerance of at most 200% of a mean thickness of the flank coating to the side faces of the mesa structure and completely encloses the mesa structure,
wherein step D) takes place without an additional etching mask for the anisotropic etching,
   in step C) and before step D) an etching mask layer for isotropic etching is applied isotropically and all over to the cladding, and
   the etching mask layer is completely removed in a following method step.

2. A method of producing optoelectronic semiconductor components comprising:
   A) providing a semiconductor layer sequence on a carrier top of a carrier,
   B) patterning the semiconductor layer sequence such that at least one mesa structure is formed with side faces,
   C) applying at least a portion of a cladding to the semiconductor layer sequence with the mesa structure by a conformal coating method such that all free surfaces are covered by the cladding), and
   D) anisotropically etching the cladding such that a flank coating is created from the cladding, which coating is limited with a tolerance of at most 200% of a mean thickness of the flank coating to the side faces of the mesa structure and completely encloses the mesa structure,
wherein step D) takes place without an additional etching mask for the anisotropic etching, the mean thickness of the flank coating is 10 nm to 1 µm,
a mean angle of the side faces to a growth direction of the semiconductor layer sequence is 2° to 40° and to the carrier top is 50° to 88°, and
at least a portion of the cladding is deposited by atomic layer deposition.

3. The method according to claim 2, wherein
an active zone of the semiconductor layer sequence for the production of light is located in the mesa structure and the active zone is enclosed by the flank coating,
the finished semiconductor components are light-emitting diodes,
the carrier top is exposed in places in step B), and
in step D), the carrier top and a mesa top of the mesa structure remote from the carrier are freed from the cladding and the flank coating is retained as far as the carrier top and as far as the mesa top, respectively, with a tolerance of at most 100% of the mean thickness of the flank coating.

4. The method according to claim 2, wherein
the mesa structure following step D) projects above the flank coating in a direction away from the carrier by at least 20 nm and at most 0.5 µm,
the active zone reaches as far as the side faces and on the side faces is covered completely by the flank coating, and
the active zone inside the associated mesa structure is a continuous, coherent and unbroken layer.

5. The method according to claim 2, wherein
the carrier comprises a sacrificial layer on the carrier top, and
the sacrificial layer is removed following step D) completely in regions not covered by the mesa structure and is removed partially in regions between the mesa structure and the carrier such that the mesa structure temporarily projects above the sacrificial layer all around.

6. The method according to claim 5, wherein
the sacrificial layer is etched selectively with respect to the flank coating,
the partial removal of the sacrificial layer by etching only takes place following completion of the flank coating, and
a complete detachment of the semiconductor layer sequence from the carrier takes place by mechanical force.

7. An optoelectronic semiconductor component comprising:
a semiconductor layer sequence with an active zone for the production of light, and
a flank coating,
wherein
the flank coating has an inner first sublayer with a constant layer thickness and an outer second sublayer,
the semiconductor layer sequence is patterned to a mesa structure with side faces lying externally,
the active zone reaches as far as the side faces and is covered by both sublayers all around on the side faces,
the second sublayer projects beyond the first sublayer along the side faces when seen in cross section such that the first sublayer is completely enclosed by the second sublayer together with the semiconductor layer sequence, and
the flank coating is limited to the side faces and covers the side faces to at least 90%.

8. A method of producing optoelectronic semiconductor components comprising:

A) providing a semiconductor layer sequence on a carrier top of a carrier,
B) patterning the semiconductor layer sequence such that at least one mesa structure is formed with side faces,
C) applying at least a portion of a cladding to the semiconductor layer sequence with the mesa structure by a conformal coating method such that all free surfaces are covered by the cladding), and
D) anisotropically etching the cladding such that a flank coating is created from the cladding, which coating is limited with a tolerance of at most 200% of a mean thickness of the flank coating to the side faces of the mesa structure and completely encloses the mesa structure,
wherein step D) takes place without an additional etching mask for the anisotropic etching,
the cladding and the flank coating are each composed of several sublayers directly following one another, and
the sublayers have materials different from one another and have different extensions along the side faces when seen in cross section.

9. The method according to claim 8, further comprising:
F) applying only a second of the sublayers after step D),
E) between steps D) and F), a first of the sublayers produced directly on the mesa structure in step D), isotropically etched such that the first sublayer no longer touches the carrier top after step E),
the second sublayer touches the carrier top in places after step F), and
G) anisotropically etching the second sublayer after step F).

10. The method according to claim 9, wherein
the sublayers are applied by different application methods in steps C) and F),
the second sublayer is thicker than the first sublayer by at least a factor of 3, and
the sublayers are transmissive for visible light and electrically insulating.

11. A method of producing optoelectronic semiconductor components comprising:
A) providing a semiconductor layer sequence on a carrier top of a carrier,
B) patterning the semiconductor layer sequence such that at least one mesa structure is formed with side faces,
C) applying at least a portion of a cladding to the semiconductor layer sequence with the mesa structure by a conformal coating method such that all free surfaces are covered by the cladding), and
D) anisotropically etching the cladding such that a flank coating is created from the cladding, which coating is limited with a tolerance of at most 200% of a mean thickness of the flank coating to the side faces of the mesa structure and completely encloses the mesa structure,
wherein step D) takes place without an additional etching mask for the anisotropic etching,
the carrier is removed completely from the semiconductor layer sequence after step D), and
the semiconductor layer sequence is grown on the carrier in step A).

12. A method of producing optoelectronic semiconductor components comprising:
A) providing a semiconductor layer sequence on a carrier top of a carrier,
B) patterning the semiconductor layer sequence such that at least one mesa structure is formed with side faces, C) applying at least a portion of a cladding to the semiconductor layer sequence with the mesa structure by a conformal coating method such that all free surfaces are covered by the cladding), and D) anisotropically etching the cladding such that a flank coating is created from the cladding, which coating is limited with a tolerance of at most 200% of a mean thickness of the flank coating to the side faces of the mesa structure and completely encloses the mesa structure, wherein step D) takes place without an additional etching mask for the anisotropic etching, after step D), the carrier is singulated in regions between the mesa structures, the singulation takes place by laser radiation, sawing or grinding, and during singulation, no material of the flank coating is removed and singulation trenches are spaced from the flank coating.

13. A method of producing optoelectronic semiconductor components comprising:

A) providing a semiconductor layer sequence on a carrier top of a carrier,

B) patterning the semiconductor layer sequence such that at least one mesa structure is formed with side faces, C) applying at least a portion of a cladding to the semiconductor layer sequence with the mesa structure by a conformal coating method such that all free surfaces are covered by the cladding), and D) anisotropically etching the cladding such that a flank coating is created from the cladding, which coating is limited with a tolerance of at most 200% of a mean thickness of the flank coating to the side faces of the mesa structure and completely encloses the mesa structure, wherein step D) takes place without an additional etching mask for the anisotropic etching, a first sublayer of the flank coating comprises at least one of the following materials or consists of one or more of these materials: aluminum oxide and aluminum nitride, a second sublayer of the flank coating comprises at least one of the following materials or consists of one or more of these materials: an oxide of Al or Si or Ti or Ta, a nitride of Al or Si or Ti or Ta or W, TiWN, a parylene, a silicone, a silazane, a photoresist and an ormocer, the semiconductor layer sequence is based on AlInGaAs, AlInGaN or AlInGaP, and the carrier comprises at least one of the following materials or consists of one or more of these materials: Si, Ge, Mo and sapphire.

* * * * *